(12) United States Patent
Chang et al.

(10) Patent No.: US 7,238,963 B2
(45) Date of Patent: Jul. 3, 2007

(54) SELF-ALIGNED LDD THIN-FILM TRANSISTOR AND METHOD OF FABRICATING THE SAME

(75) Inventors: Shih Chang Chang, Hsinchu (TW);
De-Hua Deng, Ba-De (TW);
Chun-Hsiang Fang, Yilan Hsien (TW);
Yaw-Ming Tsai, Taichung Hsien (TW);
Chang-Ho Tseng, Sinwu Township, Taoyuan County (TW)

(73) Assignee: TPO Displays Corp., Chu-Nan (TW)

( * ) Notice: Subject to any disclaimer, the term of this patent is extended or adjusted under 35 U.S.C. 154(b) by 24 days.

(21) Appl. No.: 10/833,487

(22) Filed: Apr. 27, 2004

(65) Prior Publication Data

US 2004/0227195 A1 Nov. 18, 2004

(30) Foreign Application Priority Data

Apr. 28, 2003 (TW) .............................. 92109879 A
Dec. 3, 2003 (TW) .............................. 92134005 A

(51) Int. Cl.
*H01L 29/04* (2006.01)
*H01L 29/10* (2006.01)
*H01L 31/036* (2006.01)
*H01L 31/0376* (2006.01)
*H01L 31/20* (2006.01)

(52) U.S. Cl. ............................ 257/57; 257/59; 257/61; 257/66; 257/67; 257/69; 257/70; 257/291

(58) Field of Classification Search .................. 257/57, 257/59, 61, 66–67, 69–70, 291
See application file for complete search history.

(56) References Cited

U.S. PATENT DOCUMENTS 5,292,675 A  3/1994 Codama ...................... 438/163
5,620,905 A *  4/1997 Konuma et al. ............ 438/163

(Continued)

FOREIGN PATENT DOCUMENTS

CN        1452250        10/2003

(Continued)

OTHER PUBLICATIONS

Office Action in counterpart Taiwan patent application No. TW 200302372.

*Primary Examiner*—Ida M. Soward
(74) *Attorney, Agent, or Firm*—Liu & Liu

(57) ABSTRACT

A self-aligned LDD TFT and a fabrication method thereof. A substrate is provided, on which a semiconductor layer is formed. A first masking layer is provided over a first region of the portion of the semiconductor layer. The first masking layer includes a material that provides a permeable barrier to a dopant. The semiconductor layer including the first region covered by the first masking layer is exposed to the dopant, wherein the first region covered by the first masking layer is lightly doped with the dopant in comparison to a second region not covered by the first masking region.

18 Claims, 8 Drawing Sheets

U.S. PATENT DOCUMENTS

| | | | |
|---|---|---|---|
| 6,108,056 A * | 8/2000 | Nakajima et al. | 349/38 |
| 6,114,715 A * | 9/2000 | Hamada | 257/72 |
| 6,115,094 A * | 9/2000 | Fukunaga | 349/138 |
| 6,124,604 A * | 9/2000 | Koyama et al. | 257/72 |
| 6,130,119 A * | 10/2000 | Jinnai | 438/155 |
| 6,274,887 B1 * | 8/2001 | Yamazaki et al. | 257/72 |
| 6,486,496 B2 * | 11/2002 | Chang et al. | 257/70 |
| 6,599,785 B2 * | 7/2003 | Hamada et al. | 438/151 |
| 6,617,612 B2 * | 9/2003 | Zhang et al. | 257/59 |
| 6,624,051 B1 * | 9/2003 | Ohtani et al. | 438/486 |
| 6,624,477 B1 * | 9/2003 | Takemura et al. | 257/351 |
| 6,737,306 B2 * | 5/2004 | Yamazaki et al. | 438/155 |
| 6,777,716 B1 * | 8/2004 | Yamazaki et al. | 257/88 |
| 6,952,023 B2 * | 10/2005 | Yamazaki et al. | 257/79 |
| 7,001,801 B2 * | 2/2006 | Yamazaki et al. | 438/149 |
| 2002/0025591 A1 | 2/2002 | Ohnuma et al. | |
| 2002/0041350 A1 * | 4/2002 | Yamazaki et al. | 349/113 |
| 2002/0117736 A1 * | 8/2002 | Yamazaki et al. | 257/627 |
| 2002/0119606 A1 * | 8/2002 | Hamada et al. | 438/149 |
| 2002/0134979 A1 * | 9/2002 | Yamazaki et al. | 257/59 |
| 2002/0179908 A1 * | 12/2002 | Arao | 257/72 |
| 2003/0025127 A1 * | 2/2003 | Yanai et al. | 257/158 |
| 2003/0067004 A1 * | 4/2003 | Nakazawa et al. | 257/66 |
| 2003/0094613 A1 * | 5/2003 | Joo et al. | 257/59 |
| 2003/0231263 A1 * | 12/2003 | Kato et al. | 349/56 |
| 2004/0051142 A1 * | 3/2004 | Yamazaki et al. | 257/347 |
| 2005/0218405 A1 * | 10/2005 | Yamazaki et al. | 257/66 |
| 2005/0237286 A1 * | 10/2005 | Tanada | 345/77 |

FOREIGN PATENT DOCUMENTS

| | | |
|---|---|---|
| JP | 05-047791 | 2/1993 |
| JP | 06-140421 | 5/1994 |
| JP | 06-333948 | 12/1994 |
| JP | 07-211912 | 8/1995 |
| JP | 2003-023014 | 1/2003 |
| JP | 565724 | 12/2003 |
| TW | 200302372 | 8/2003 |

* cited by examiner

SELF-ALIGNED LDD THIN-FILM TRANSISTOR AND METHOD OF FABRICATING THE SAME

BACKGROUND OF THE INVENTION

1. Field of the Invention

The invention relates to a TFT, and more particularly to a TFT with a self-aligned LDD and a method for fabricating the same.

2. Description of the Related Art

Thin-film transistors (TFTs) are widely used in active matrix liquid crystal display (AMLCD). A leakage current occurs, however, when the TFT is turned off, and the charges in the active matrix liquid crystal display are thereby lost. A lightly doped drain (LDD) structure has been used to reduce the electric field of the surface of the drain, such that the leakage current can be reduced.

In FIGS. 1A to 1B are cross-sections of the conventional method for fabricating a TFT with a self-aligned LDD.

In FIG. 1A, a transparent insulating substrate 101 is provided, a semiconductor layer 102 and a gate insulating layer 104 formed on the substrate 101, and the semiconductor layer 102 is covered by the gate insulating layer 104.

A patterned photoresist layer 106 is formed on the gate insulating layer 104. Heavy doping is performed on the semiconductor layer 102 to form a heavily doped region 108 as a source/drain (S/D) region except in the region covered by the photoresist layer 106.

In FIG. 1B, the photoresist layer 106 is removed. A gate layer 120 (e.g., a conductive layer) is formed on the gate insulating layer 104, and the gate layer 120 covers a portion of the undoped region of the semiconductor layer 102. Light doping is performed on the undoped region of the semiconductor layer 102 to form a LDD region using the gate layer 120 as a mask. The region of the semiconductor layer 102a that is covered by the gate layer 120 is a channel.

The pattern in the photoresist layer 106 defined by an additional mask in the conventional method results in a process that requires a separate masking step and doping procedure for forming the LDD region, which region is easily shifted by misalignment of the mask such that the electrical properties of TFT are affected.

SUMMARY OF THE INVENTION

The present invention provides a process of forming a semiconductor device, which comprises heavily doped and lightly doped regions in a semiconductor layer formed in a single doping operation. This is accomplished by providing a masking layer having a relatively thicker section that corresponds to a region to be lightly doped, in comparison to a region that is heavily doped.

In one embodiment of the present invention, a masking layer covers the region of the semiconductor layer to be lightly doped and exposes the region of the semiconductor layer to be heavily doped during the doping process. The masking layer is permeable to dopant, but provides a barrier to the dopant such that the covered region is lightly doped compared to the heavily doped region. The thickness of the mask is chosen in relation to the doping parameters (e.g., time, dopant, concentration, etc.) to result in the desired doping levels in the lightly doped region and the heavily doped region in a single doping operation.

In another aspect of the present invention, it is directed to a self-aligned LDD TFT and a method for fabricating the same. LDD region of the present invention is formed by controlling the width and/or width of the gate insulating layer using only one mask.

In another aspect, the present invention provides a LDD TFT having a multi-gate structure, in which LDD regions are formed laterally adjacent to two sidewalls of each gate layer in the multi-gate structure. Each gate structure is formed with LDD and highly doped regions in accordance with the present invention, and two adjacent gate structures are interconnected by a common doped region having a different dopant concentration as the LDD region. In one embodiment, the common doped region is higher dope concentration than the LDD region, but lower dope concentration as the highly doped region. The common doped region may be formed by applying a shielding mask during an intermediate doping step between formation of LDD and highly doped regions.

Accordingly, the present invention provides a self-aligned LDD TFT. The TFT comprises a substrate, a semiconductor layer, a gate insulating layer, and a gate. The semiconductor layer having a channel is formed on the substrate, a first doping region is formed on both sides of the channel region, and a second doping region is formed on both sides of the first doping region. The gate insulating layer is formed, covering the semiconductor layer, and the gate insulating layer covers the channel region and the first doping region. The gate is formed on the gate insulating layer corresponding to the channel region.

Accordingly, the present invention also provides a LDD TFT having a multi-gate structure. An active layer is formed on a substrate and comprises a first lightly doped region, a second lightly doped region, and a third lightly doped region formed laterally adjacent to the first lightly doped region respectively, a first channel region and a second channel region extending laterally away from the second lightly doped region and the third lightly doped region respectively, a fourth lightly doped region and a fifth lightly doped region extending laterally away from the first channel region and the second channel region respectively, and a first heavily doped region and a second heavily doped region extending laterally away from the fourth lightly doped region and the fifth lightly doped region, respectively. A first gate insulating layer is formed on the active layer and comprises a central region covering the first channel region of the active layer, a first shielding region covering the fourth lightly doped region of the active layer, and a second shielding region covering the second lightly doped region of the active layer. A second gate insulating layer is formed on the active layer and comprises a central region covering the second channel region of the active layer, a first shielding region covering the third lightly doped region of the active layer, and a second shielding region covering the fifth lightly doped region of the active layer. A first gate layer covers the central region of the first gate insulating layer, and a second gate layer covers the central region of the second gate insulating layer.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

The present invention provides a process for forming a semiconductor device, in which heavily doped and lightly doped regions are simultaneously formed in a semiconductor layer during doping operation. This is accomplished by providing a masking layer having a relatively thicker section that correspond to a region to be lightly doped, in comparison to a region that is heavily doped. By way of example and not limitations, the present invention is described below in connection with the formation of an LDD TFT.

In one embodiment of the present invention, a masking layer covers the region of the semiconductor layer to be lightly doped and exposes the region of the semiconductor layer to be heavily doped during the doping process. The masking layer is permeable to dopant, but provides a barrier to the dopant such that the covered region is lightly doped compared to the heavily doped region. The thickness of the masking layer is chosen in relation to the doping parameters (e.g., doping time, concentration, dopant, etc.) to result in the desired doping levels in the lightly doped region and the heavily doped region. This embodiment is illustrated in reference to FIGS. 2A to 2F below. It is noted that intermediate and/or additional steps and structures maybe included without departing from the scope and spirit of the present invention, but they are omitted from the drawings to avoid obscuring the disclosure of the present invention.

FIRST EMBODIMENT

FIGS. 2A to 2F are cross-sections illustrating the steps of the method for fabricating a self-aligned LDD TFT in accordance with the first embodiment of the present invention.

Figure 1A:
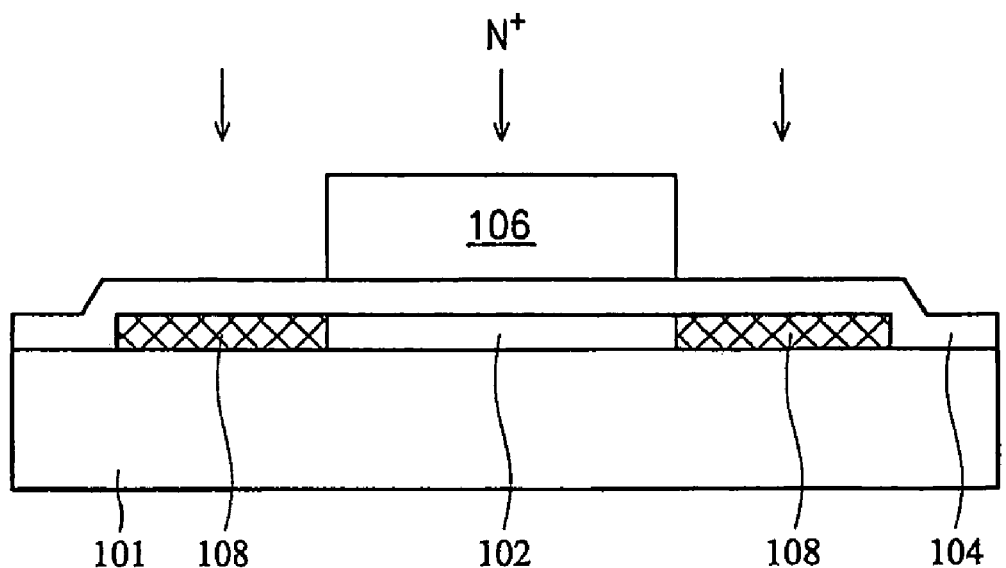
FIGS. 1A to 1B are cross-sections illustrating the steps of the conventional method for fabricating a self-aligned LDD TFT.
Figure 1B:
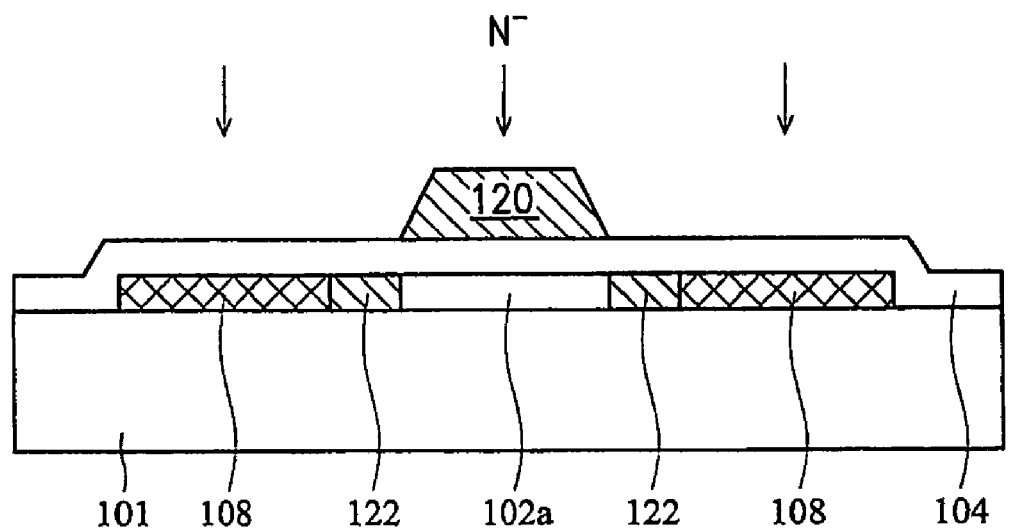
Figure 2A:
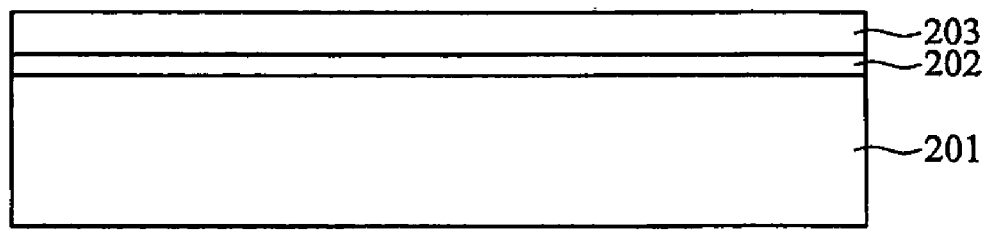
FIGS. 2A to 2F are cross-sections illustrating the steps of the method for fabricating a self-aligned LDD TFT in accordance with the first embodiment of the present invention.

In FIG. 2A, a substrate 201, such as a transparent insulating substrate or glass substrate, is provided. A buffer layer 202, such as a silicon oxide layer, and a semiconductor layer 203, such as a polysilicon layer, are sequentially formed on the substrate 201. The buffer layer 202 helps the formation of the semiconductor layer 203 on the substrate 201.

Figure 2B:
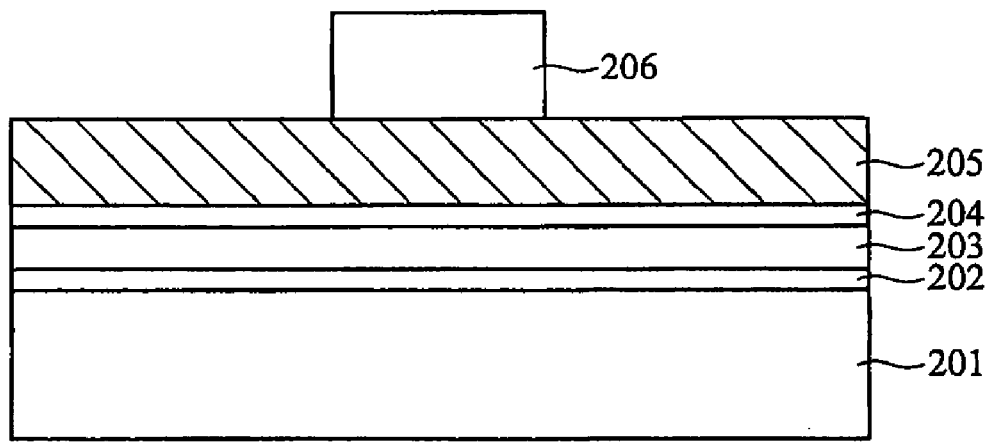

In FIG. 2B, a gate insulating layer 204, such as an oxide layer or a nitride layer, a conductive layer 205, such as a metal layer, and a patterned photoresist layer 206 for forming a gate, are sequentially formed on the semiconductor layer 203. The thickness of the gate insulating layer 204 is about 200 to 10000 Å.

Figure 2C:
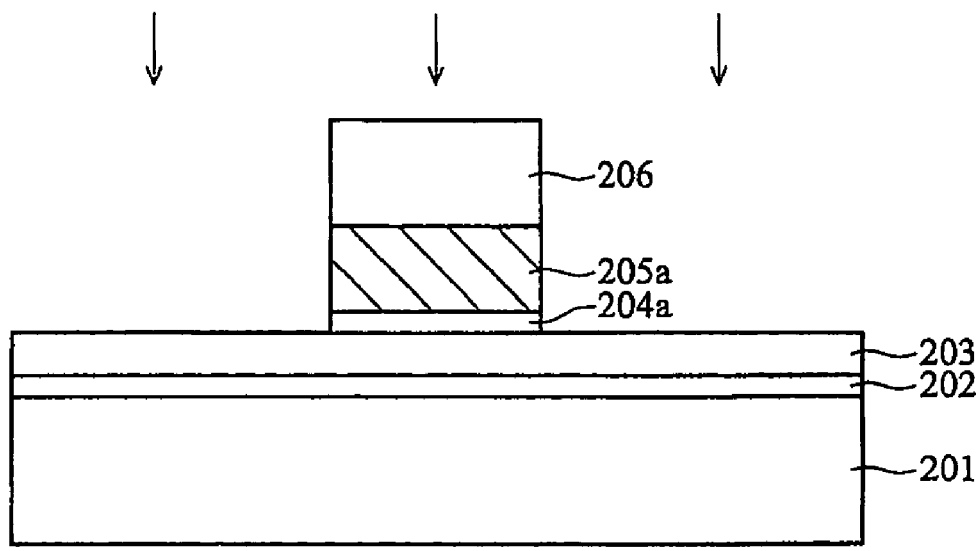

In FIG. 2C, the conductive layer 205 and the gate insulating layer 204 are sequentially etched until the semiconductor layer 203 is exposed to form a conducting layer 205a and a gate insulating layer 204a. The etching can be plasma etching.

Figure 2D:
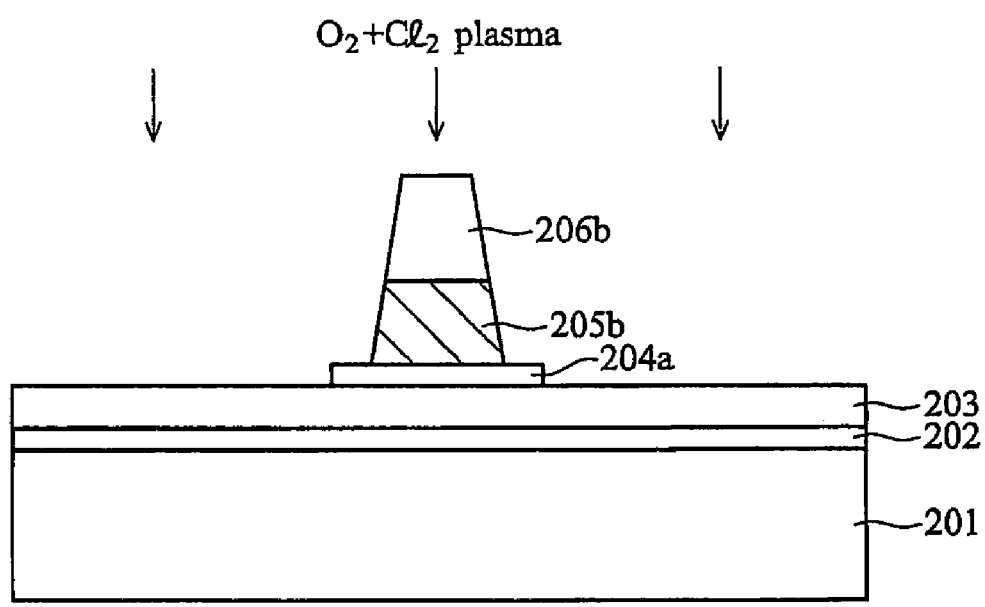

In FIG. 2D, the conductive layer 205a is etched by a gas mixture of oxygen-containing gas and other gas, such as chlorine-containing gas, to form a conductive layer 205b as a gate so as to expose a portion of the gate insulating layer 204a synchronously.

The flow rate of the oxygen in the gas mixture can be adjusted, and the etching step shown in FIG. 2C can be omitted or combined with the etching step shown in FIG. 2D to reduce processing time. In this case, the conductive layer 205a and the gate insulating layer 204a are etched by a minimum flow of oxygen, and the conductive layer 205a is etched to form a trapezoid gate, by increasing the flow rate of oxygen, even a maximum oxygen flow.

Figure 2E:
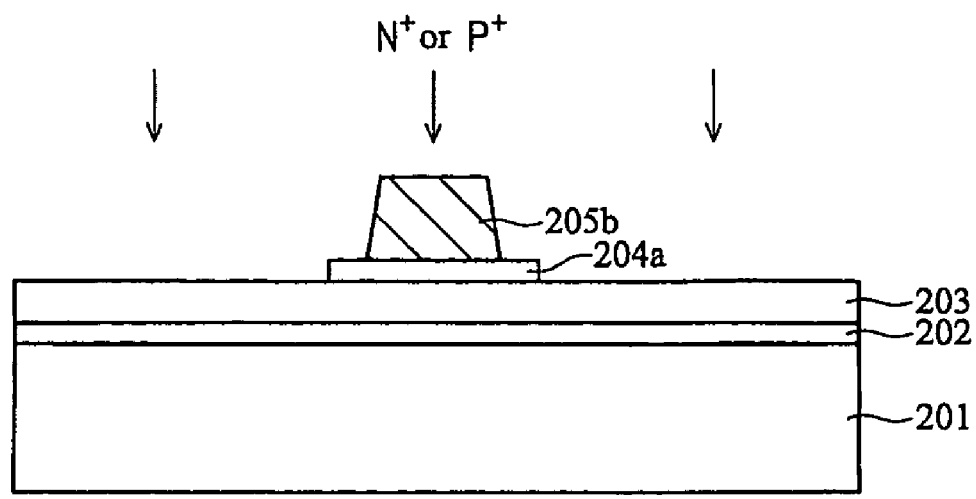

In FIG. 2E, the patterned photoresist layer 206b is removed. The semiconductor layer 203 is ion implanted with about 30 to 100 kev energy using the conducting layer 205b and the gate insulating layer 204a as masks to form a first doped region 203b as lightly doped drain (LDD) and a second doped region 203c as source/drain (S/D).

Figure 2F:
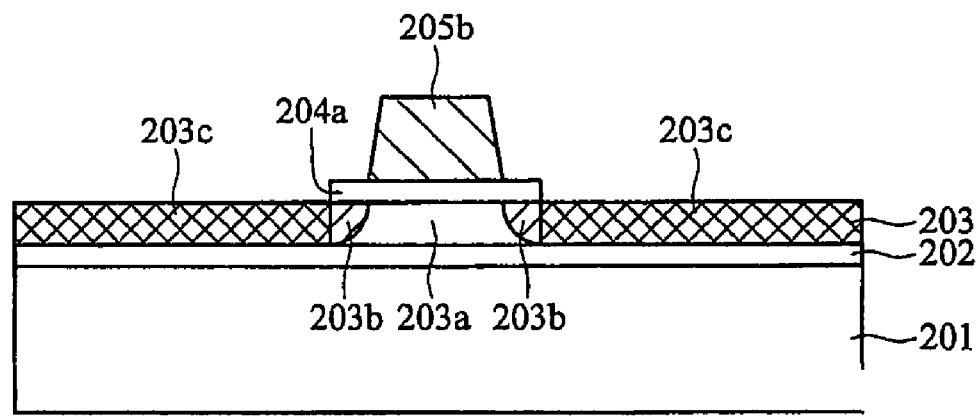

In FIG. 2F, the first doped region 203b is formed in the semiconductor layer 203, covered by the gate insulating layer 204a but not the conductive layer 205b. The second doped region 203c is formed in the semiconductor layer 203 covered by the gate insulating layer 204a and the conductive layer 205b.

The concentration of the first doped region 203b is lower than in the second doped region 203c because the first doped region 203b is covered by the gate insulating layer 204a and the second doped region 203c is not covered by the gate insulating layer 204a. By appropriately defining the thickness of the gate insulating layer 204a in relation to the doping process parameters (e.g., dopant, doping time, concentration, etc.), the desired doping concentrations in the first and second doped regions 203b and 203c may be achieved when they are exposed to the same doping operation, e.g., using the same doping process parameters.

For certain applications, it may be desired to alter the doping process parameters and/or using a different or additional mask during the doping process. For example, after initial doping to form the lightly and heavily doped regions using a particular dopant concentration, a mask may be applied to cover the lightly doped region. Such variation is well within the scope and spirit of the present invention.

FIG. 2F is a simplified basic LDD TFT configuration, including a drain, source and a channel. Further steps to complete the may include steps to form, for example, electrodes, metalization, interconnect structures, passivation layers, etc. known in the art.

In a case of a TFT with CMOS, the semiconductor layer 203 is heavily implanted with P or As ions to form S/D, a second doped area 203c, and a first doped region 203b. The concentration of S/D and the second doped region 203c are about $1 \times 10^{14} \sim 1 \times 10^{16}$ atom/cm$^2$, and the concentration of the first doped region 203b is about $1 \times 10^{12} \sim 1 \times 10^{14}$ atom/cm$^2$.

The present invention also provides a LDD TFT having a multi-gate structure and a fabrication method thereof. A gate insulating layer comprises two shielding regions laterally exposed to a gate layer and used as a mask, such that LDD regions and source/drain regions can be completed in an ion implantation process simultaneously. Also, the LDD regions are formed laterally adjacent to two sidewalls of each gate layer in the multi-gate structure, thus effectively restraining leakage current and eliminating placement shifting and length-asymmetry problems caused by the photo misalignment. A LDD TFT having a dual-gate structure is described below for example.

SECOND EMBODIMENT

FIGS. 3A to 3E are cross-sections of a fabrication method for a LDD TFT having a dual-gate structure according to this embodiment.

Figure 3A:
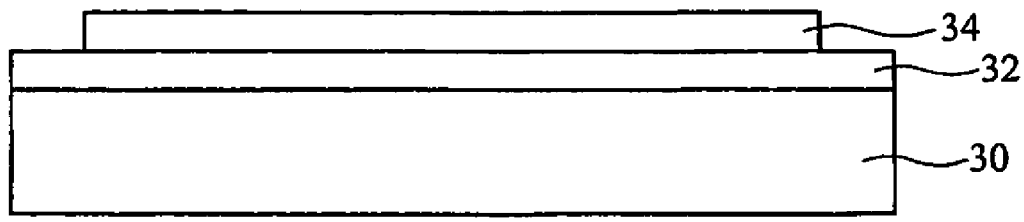
FIGS. 3A to 3E are cross-sections of a fabrication method for a LDD TFT having a dual-gate structure according to the second embodiment of the present invention.

In FIG. 3A, a substrate 30 is provided with a buffer layer 32 and a semiconductor layer 34 successively formed thereon. The substrate 30 is a transparent insulating substrate, such as a glass substrate. The buffer layer 32 is a dielectric layer, such as a silicon oxide layer, for improving the formation of the semiconductor layer 34 on the substrate 30. The semiconductor layer 34 is a polysilicon layer. In order to adjust threshold voltage of transistor, $B^+$ or $P^+$ ion implantation process may be performed thereon.

Figure 3B:
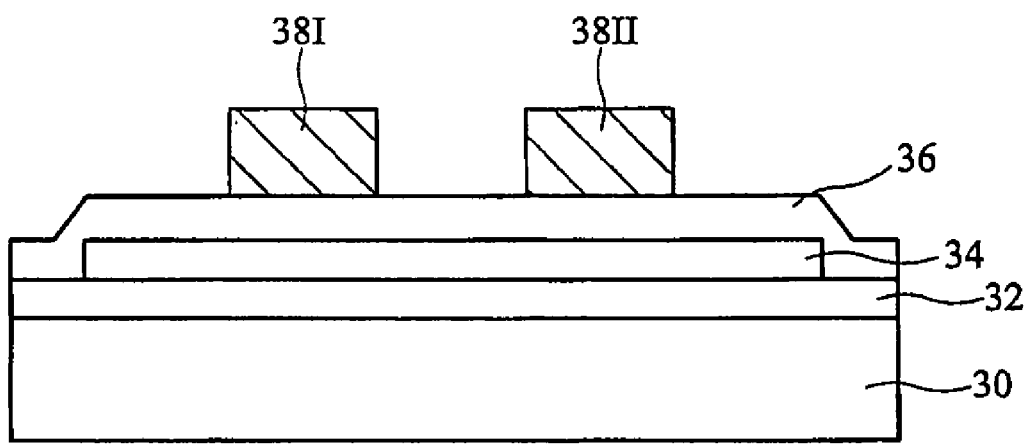
Figure 3C:
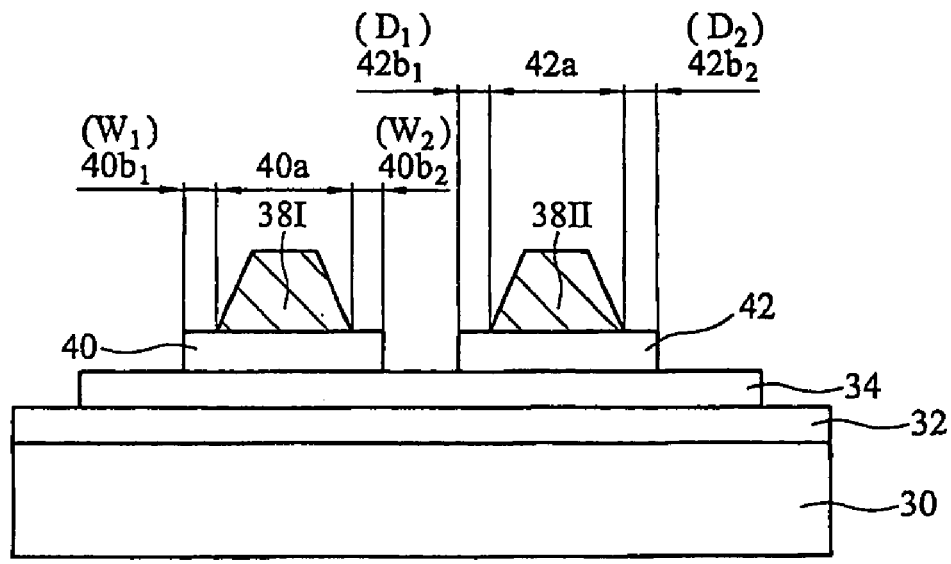

In FIG. 3B, an insulating layer 36 and a conductive layer 38 are successively deposited on the semiconductor layer 34. The insulating layer 36 may be made of silicon oxide, silicon nitride, silicon-oxide-nitride or a combination thereof. The conductive layer 38 (not shown) may be a metal layer or a polysilicon layer. Dry etching with a patterned photoresist mask then forms the conductive layer 38 as a first gate layer 38I and a second gate layer 38II. In FIG. 3C, plasma etching or reactive ion etching is employed with a reactive gas mixture of an oxygen-containing gas and a chlorine-containing gas, whereby the gate layers 38I and 38II of a trapezoid profile and two isolated gate insulating layers 40 and 42 are completed by adjusting the individual flow of the oxygen-containing gas or the chlorine-containing gas in a timely manner. For example, during the etching process for the gate layers 38I and 38II, the flow of the chlorine-containing gas is gradually tuned to a maximum, even if chlorine-containing gas is the only gas used. During the etching process for the insulating layer 36, the flow of the oxygen-containing gas is gradually increased to a maximum, such that a part of the patterned photoresist mask is removed and the gate layers 38I and 38II exposed again by the patterned photoresist mask is etched simultaneously. The photoresist mask is then removed.

The first gate insulating layer 40 comprises a central region 40a and two shielding regions $40b_1$ and $40b_2$. The central region 40a is covered by the bottom of the first gate layer 38I. The two shielding regions $40b_1$ and $40b_2$ extend laterally away from the central region 40a, respectively, without being covered by the first gate layer 38I. The first gate insulating layer 40 exposes a predetermined source/drain region. The first shielding region $40b_1$ has a lateral length $W_1$ of 0.1 µm~2.0 µm, and the second shielding region $40b_2$ a lateral length $W_2$ of 0.1 µm~2.0 µm. Depending on requirements for circuit designs, the size and symmetry of the lateral lengths $W_1$ and $W_2$ may be adequately modified.

The second gate insulating layer 42 comprises a central region 42a and two shielding regions $42b_1$ and $42b_2$. The central region 42a is covered by the bottom of the second gate layer 38II. The two shielding regions $42b_1$ and $42b_2$ extend laterally away from the central region 42a, respectively, without being covered by the second gate layer 38II. The second gate insulating layer 42 exposes a predetermined source/drain region. The first shielding region $42b_1$ has a lateral length $D_1$ of 0.1 µm~2.0 µm, and the second shielding region $42b_2$ has a lateral length $D_2$ of 0.1 µm~2.0 µm. Depending on requirements for circuit designs, the size and symmetry of the lateral lengths $W_1$, $W_2$, $D_1$ and $D_2$ may be adequately modified. For example, $W_1=W_2$ and $D_1=D_2$.

The second shielding region $40b_2$ of the first gate insulating layer 40 is located adjacent to the first shielding region $42b_1$ of the second gate insulating layer 42, and a space between the second shielding region $40b_2$ and the first shielding region $42b_1$ exposes the active layer 34. Also, the active layer 34 outside the first shielding region $40b_1$ of the first gate insulating layer 40 and the second shielding region $42b_2$ of the second gate insulating layer 42 is exposed.

Figure 3D:
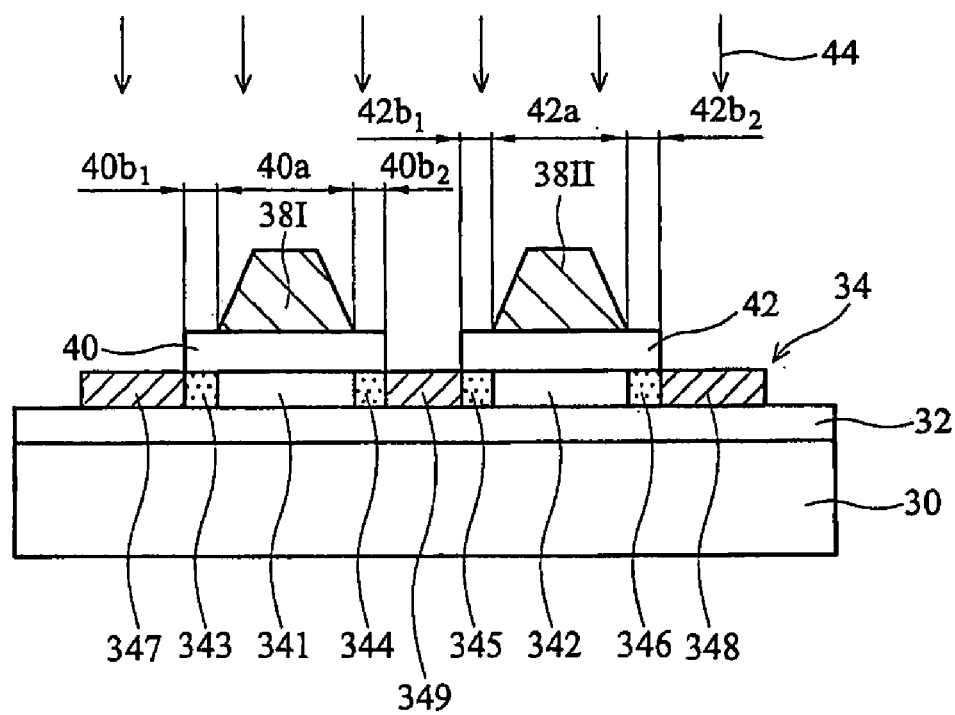

In FIG. 3D, a lightly doped ion implantation process 44 is employed, and the gate layers 38I and 38II and the shielding regions $40b_1$, $40b_2$, $42b_1$ and $42b_2$ are used as masks, such that a plurality of regions 341~349 with various doping concentrations is formed in the active layer 34. The first region 341 and the second region 342 are undoped, correspondingly located underlying the central regions 40a and 42a, respectively. The third region 343 and the fourth region 344 are $N^{--}$ regions, correspondingly located underlying the shielding regions $40b_1$ and $40b_2$, respectively. The fifth region 345 and the sixth region 346 are $N^{--}$ regions, correspondingly located underlying the shielding regions $42b_1$ and $42b_2$, respectively. The seventh region 347 is an $N^-$ region exposed laterally adjacent to the first shielding region $40b_1$ of the first gate insulating layer 40. The eighth region 348 is an $N^-$ region exposed laterally adjacent to the second shielding region $42b_2$ of the second gate insulating layer 42. The ninth region 349 is an $N^-$ region exposed in the space between the shielding regions $40b_2$ and $42b_1$. Since the shielding regions $40b_1$ and $40b_2$ are used as masks, the margins of the regions 343 and 344 are substantially aligned to the edges of the shielding regions $40b_1$ and $40b_2$, respectively. Since the shielding regions $42b_1$ and $42b_2$ are used as masks, the margins of the regions 345 and 346 are substantially aligned to the edges of the shielding regions $42b_1$ and $42b_2$ respectively. In addition, by adjusting accelerated voltage and dosage of the lightly doped ion implantation process 44, the doping concentrations of the regions 343, 344, 345 and 346 can be modified to become $N^{--}$ regions or intrinsic regions (offset regions).

Figure 3E:
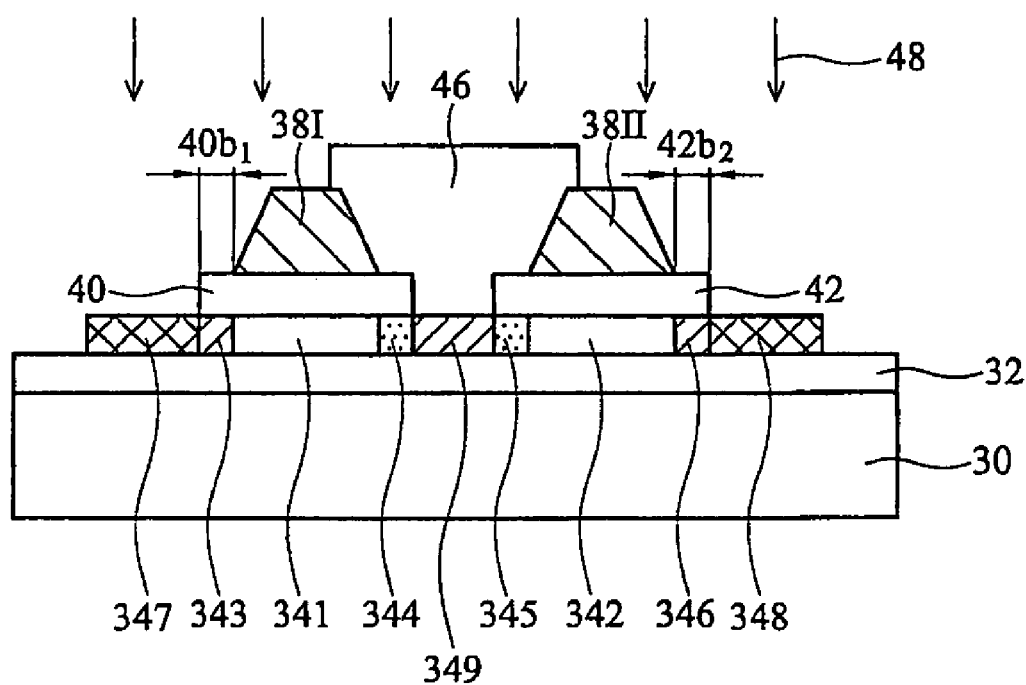

In FIG. 3E, a photoresist layer 46 is formed to cover the second shielding region $40b_2$ of the first gate insulating layer 40, the first shielding region $42b_1$ of the second gate insulating layer 42, and the ninth region 349 exposed in the space between the shielding regions $40b_2$ and $42b_1$. Finally, a heavily-doped ion implantation process 48 is performed, and the photoresist layer 46, the gate layers 38I and 38II, and the shielding regions $40b_1$ and $42b_2$ are used as masks, such that the doping concentrations of the regions 343 and 346 are increased to become $N^-$ regions and the doping concentrations of the regions 347 and 348 are increased to become $N^+$ regions.

Accordingly, the seventh region 347 and the eighth region 348 are $N^+$ regions, serving as a source region and a drain region respectively. The third region 343 and the sixth region 346 are $N^-$ regions, serving as two LDD regions. The fourth region 344 and the fifth region 345 are $N^{--}$ regions, serving as another two LDD regions, located between the two gate layers 38I and 38II. The ninth region 349 is an $N^-$ region, serving as common source/drain region. The first region 341 and the second region 342 are undoped, serving as two channel regions of the dual-gate structure. Preferably, the doping concentration for regions 347 and 348 is $1\times10^{14}$~$1\times10^{16}$ atom/cm$^2$, for regions 343, 346 and 349, $1\times10^{12}$~$1\times10^{14}$ atom/cm$^2$, and for regions 344 and 345, less than $1\times10^{13}$ atom/cm$^2$.

The LDD TFT may be used in a N-MOS TFT, such that the lightly doped regions are $N^-$ regions, and heavily doped regions are $N^+$ regions. Alternatively, the LDD TFT is used in a P-MOS TFT, such that the lightly doped regions are $P^-$ regions, and heavily doped regions are $P^+$ regions. Subsequent interconnect process including formation of interdielectric layers, contact holes and interconnects on the thin film transistor is omitted herein.

The LDD TFT and the fabrication method thereof have the following advantages.

First, two symmetrical LDD regions outside the two gate layers 38I and 38II and two symmetrical LDD regions between the two gate layers 38I and 38II are formed simultaneously, thus effectively reducing current leakage.

Second, the ion implantation process uses the shielding regions $40b_1$, $40b_2$, $42b_1$ and $42b_2$ as masks, thus completing self-aligned LDD regions and source/drain regions simultaneously.

Third, by adjusting parameters of the etching process, the lateral lengths $W_1$, $W_2$, $D_1$ and $D_2$ of the shielding regions $40b_1$, $40b_2$, $42b_1$ and $42b_2$ can be accurately controlled, thus ensuring proper positioning of the LDD structure and electric performance of the LDD TFT.

Fourth, since an extra photomask or a spacer structure for defining the LDD regions are not used, shifting of the LDD regions due to photo misalignment in exposure is prevented, further improving accuracy in positioning the LDD regions.

Fifth, the heavily doped ion implantation process 48 uses the photoresist layer 46 as a mask without a high-accuracy pattern, thus simplifying a photolithography process for the photoresist layer 46.

FIG. 3E is a simplified basic LDD TFT having a multi-gate structure configuration. Further steps to complete the LDD TFT may include steps to form, for example, electrodes, metalization, interconnect structures, passivation layers, etc. known in the art.

Figure 4:
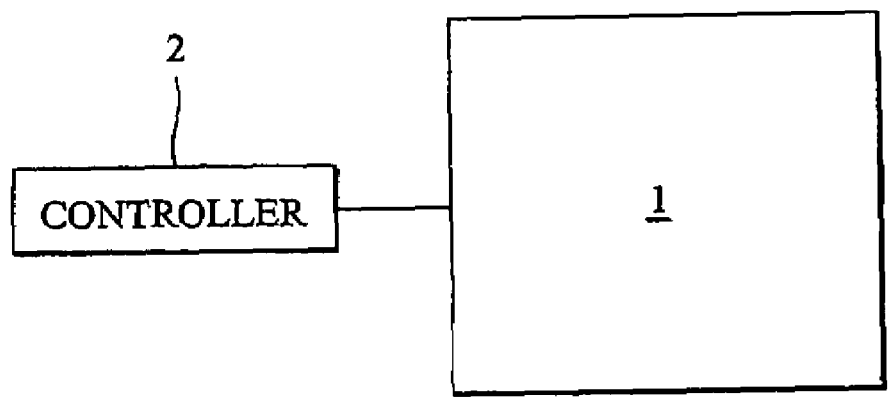
FIG. 4 is a schematic diagram of a display device comprising the LDD TFT in accordance with one embodiment of the present invention.

FIG. 4 is a schematic diagram of a display device 3 comprising the LDD TFT in accordance with one embodiment of the present invention. The display panel 1 can be couple to a controller 2, forming a display device 3 as shown in FIG. 4. The controller 3 can comprise a source and a gate driving circuits (not shown) to control the display panel 1 to render image in accordance with an input.

Figure 5:
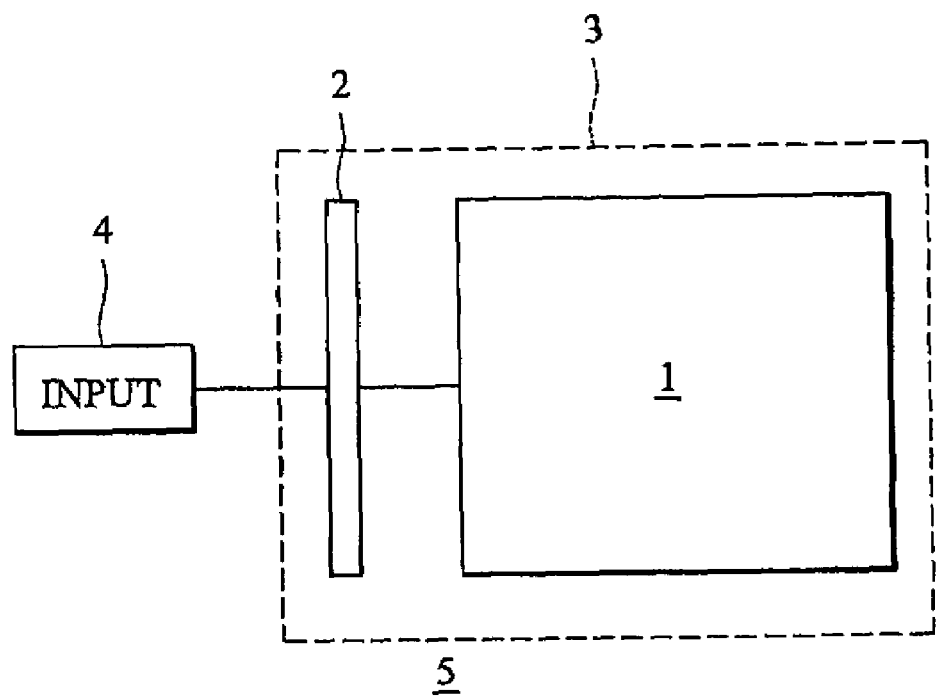
FIG. 5 is a schematic diagram of an electronic device comprising the display device in accordance with the present invention.

FIG. 5 is a schematic diagram of an electronic device 5, incorporating a display comprising the LDD TFT in accordance with one embodiment of the present invention. An input device 4 is coupled to the controller 2 of the display device 3 shown in FIG. 4 can include a processor or the like to input data to the controller 2 to render an image. The electronic device 5 may be a portable device such as a PDA, notebook computer, tablet computer, cellular phone, or a desktop computer.

The present invention provides a method for accurately forming LDD structure of TFT by adjusting the width and thickness of the gate insulating layer and the energy of the implantation. Additional masks to define a pattern of LDD are not required, and errors from misalignment of the mask are avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor having a multi-gate structure, comprising:
   a substrate;
   an active layer formed on the substrate and comprising:
      a first lightly doped region;
      a second lightly doped region and a third lightly doped region formed laterally adjacent to the first lightly doped region respectively;
      a first channel region and a second channel region extending laterally away from the second lightly doped region and to third lightly doped region respectively;
      a fourth lightly doped region and a fifth lightly doped region extending laterally away from the first channel region and the second channel region respectively; and
      a first heavily doped region and a second heavily doped region extending laterally away from the fourth lightly doped region and the fifth lightly doped region respectively;
   a first gate insulating layer formed on the active layer and comprising:
      a central region covering the first channel region of the active layer;
      a first shielding region covering the fourth lightly doped region of the active layer; and
      a second shielding region covering the second lightly doped region of the active layer;
   a second gate insulating layer formed on the active layer and comprising:
      a central region covering the second channel region of the active layer;
      a first shielding region covering the third lightly doped region of the active layer; and
      a second shielding region covering the fifth lightly doped region of the active layer;
   a first gate layer covering the central region of the first gate insulating layer; and
   a second gate layer covering the central region of the second gate insulating layer;
   wherein margin of at least one of the second lightly doped region and the third lightly doped region is substantially aligned to an edge of the second shielding region of the first gate insulating layer, and at least one of the fourth lightly doped region and the fifth lightly doped region is substantially aligned to an edge of the second shielding region of the second gate insulating layer.

2. A display device, comprising:
   a display panel comprising a thin film transistor as claimed in claim 1; and
   a controller coupled to the display panel to control the display panel to render an image in accordance to an input.

3. An electronic device, comprising:
   a display panel comprising a thin film transistor as claimed in claim 1;
   a controller coupled to the display panel to control the display panel to render an image in accordance to an input; and
   an input device couple to the controller of the display device to render an image.

4. A thin film transistor having a multi-gate structure, comprising:
   a substrate;
   an active layer formed on the substrate and comprising:
      a first lightly doped region;
      a second lightly doped region and a third lightly doped region formed laterally adjacent to the first lightly doped region respectively;

a first channel region and a second channel region extending laterally away from the second lightly doped region and the third lightly doped region respectively;

a fourth lightly doped region and a fifth lightly doped region extending laterally away from the first channel region and the second channel region respectively; and a first heavily doped region and a second heavily doped region extending laterally away from the fourth lightly doped region and the fifth lightly doped region respectively;

a first gate insulating layer formed on the active layer and comprising:

a central region covering the first channel region of the active layer;

a first shielding region covering the fourth lightly doped region of the active layer; and a second shielding region covering the second lightly doped region of the active layer;

a second gate insulating layer formed on the active layer and comprising:

a central region covering the second channel region of the active layer;

a first shielding region covering the third lightly doped region of the active layer; and a second shielding region covering the fifth lightly doped region of the active layer;

a first gate layer covering the central region of the first gate insulating layer; and a second gate layer covering the central region of the second gate insulating layer;

wherein, the margin of the second lightly doped region is substantially aligned to the edge of the second shielding region of the first gate insulating layer, the margin of the third lightly doped region is substantially aligned to the edge of the first shielding region of the second gate insulating layer;

the margin of the fourth lightly doped region is substantially aligned to tbe edge of the first shielding region of the first gate insulating layer; and the margin of the fifth lightly doped region is substantially aligned to the edge of the second shielding region of the second gate insulating layer.

5. The thin film transistor having a multi-gate structure as claimed in claim 4, wherein the second lightly doped region and the third lightly doped region have the same doping concentration and length.

6. The thin film transistor having a multi-gate structure as claimed in claim 4, wherein the fourth lightly doped region and the fifth lightly doped region have the same doping concentration and length.

7. The thin film transistor having a multi-gate structure as claimed in claim 4, wherein, each of the first lightly doped region, the fourth lightly doped region and the fifth lightly doped region has a doping concentration of $1\times10^{12} \sim 1\times10^{14}$ atom/cm$^2$;

each of the second lightly doped region and third lightly doped region has a doping concentration less than $1\times10^{13}$ atom/cm$^2$; and each of the first heavily doped region and second heavily doped region has a doping concentrantion of $1\times10^{14} \sim 1\times10^{16}$ atom/cm$^2$.

8. The thin film transistor having a multi-gate structure as claimed in claim 4, wherein the first, second, third, fourth and fifth lightly doped regions and the first and second heavily doped regions are the same conductive type.

9. A thin film transistor, comprising:

a substrate;

a semiconductor layer formed on the substrate, having a first channel region, a second channel region, and a doped region formed between the first channel region and the second channel region, wherein the doped region comprises a first doping region and a second doping region formed on both sides of the first doping region;

a first heavily doped region on a side of the first channel region away from the doped region, and a second heavily doped region on a side of the second channel region away from the doped region;

a first gate insulating layer and a second gate insulating layer formed on the semiconductor layer, wherein a first margin of the first doping region is substantially aligned with an edge of the first gate insulating layer and a second margin of the first doping region is substantially aligned with an edge of the second gate insulating layer;

a first gate formed on the first gate insulating layer corresponding to the first channel region; and a second gate formed on the second gate insulating layer corresponding to the second channel region, wherein the second doping region is a lightly doped area, the first doping region is a common source/drain area, concentration in the second doping region is lower than in the first doping region, and concentration in the first heavily doped region and the second heavily doped region is higher than in the first doping region.

10. The thin film transistor of claim 9, wherein the first gate insulating layer and second gate insulating layer comprise a material that provides a permeable barrier to a dopant for doping thc second doping region.

11. The thin film transistor of claim 10, wherein the first doping region and the second doping region are doped simultaneously with the dopont.

12. The thin film transistor of claim 9, wherein the second doping region corresponds to a lightly doped source/drain structure, the first doping region corresponds to a heavily doped source/drain structure.

13. The thin film transistor of claim 9, wherein the first gate insulating layer and the second gate insulating layer expose the entire first doping region.

14. The thin film transistor of claim 9, wherein the first gate insulating layer and second gate insulating layer cover the second doping region.

15. The thin film transistor of claim 9, wherein the first gate insulating layer and second gate insulating layer do not cover the first doping region.

16. The thin film transistor of claim 9, wherein the first gate insulating layer and the second gate insulator do not cover the margin between the first doping region and the second doping region.

17. The thin film transistor of claim 9, wherein margins of the doped region are substantially aligned with an edge of the first gate and an adjacent edge of the second gate.

18. The thin film transistor of claim 9, wherein a third margin of the first doping region is substantially aligned with an edge of the first gate and a fourth margin of the first doping region is substantially aligned with an edge of the second gate.

* * * * *